(12) United States Patent
Yassine et al.

(10) Patent No.: US 9,865,353 B1
(45) Date of Patent: Jan. 9, 2018

(54) CELL LOCATION PROGRAMMING FOR STORAGE SYSTEMS

(71) Applicant: KABUSHIKI KAISHA TOSHIBA, Tokyo (JP)

(72) Inventors: Hachem Yassine, Bristol (GB); Justin Coon, Bristol (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/226,326

(22) Filed: Aug. 2, 2016

(51) Int. Cl.
*G11C 16/04* (2006.01)
*G11C 16/10* (2006.01)
*G11C 16/26* (2006.01)
*G06F 12/02* (2006.01)

(52) U.S. Cl.
CPC .......... *G11C 16/10* (2013.01); *G06F 12/0246* (2013.01); *G11C 16/26* (2013.01); *G06F 2212/7201* (2013.01)

(58) Field of Classification Search
CPC ...... G11C 16/10; G11C 16/26; G06F 12/0246
See application file for complete search history.

(56) References Cited

U.S. PATENT DOCUMENTS

| | | |
|---|---|---|
| 6,397,364 B1 | 5/2002 | Barkan |
| 7,800,945 B2 | 9/2010 | Cernea |
| 9,245,630 B2 * | 1/2016 | Kwak ............... G11C 16/10 |
| 2012/0246395 A1 * | 9/2012 | Cho ............... G06F 12/0246 711/103 |
| 2016/0125947 A1 | 5/2016 | Yano |

OTHER PUBLICATIONS

Ertugrul Basar et al., "Orthogonal frequency division multiplexing with index modulation", IEEE Transactions on Signal Processing (vol. 61, No. 22, Nov. 15, 2013), 16 pages.

James McCaffrey, "Generating the mth Lexicographical Element of a Mathematical Combination," MSDN Library (Jul. 2004), 9 pages, available at https://msdn.microsoft.com/en-us/library/aa289166(vs.71).aspx.

* cited by examiner

*Primary Examiner* — Pho M Luu
(74) *Attorney, Agent, or Firm* — Finnegan, Henderson, Farabow, Garrett & Dunner, L.L.P.

(57) ABSTRACT

There is provided a memory device comprising a plurality of memory cells and a controller configured to receive data to be stored in a set of memory cells and map a first portion of the data to a selection of memory cells to be programmed from the set of memory cells, wherein the number of cells to be programmed k is less than number of cells in the set n. The controller is further configured to map a second portion of the data to a plurality of voltage levels to be programmed into the memory cells to be programmed and store the first and second portions of the data in the set of memory cells by programming each memory cell of the selection of memory cells to be programmed to a respective voltage level of the plurality of voltage levels.

18 Claims, 10 Drawing Sheets

CELL LOCATION PROGRAMMING FOR STORAGE SYSTEMS

TECHNICAL FIELD

The present disclosure relates to memory devices and methods for storing and reading data. In particular, but without limitation, this disclosure relates to memory devices and methods for storing and reading data in which a first portion of data is mapped to a pattern of programmed memory cells.

BACKGROUND

Two dimensional (2D) NAND flash memory uses floating gate transistors organised into a cell which can be programmed to store a varying level of electrical charge. The number of different voltage levels, q, to which a cell can be programmed allows representation of $\log_2 q$ binary bits per cell. Many such cells can be grouped into a logical page and pages grouped into logical blocks. A page is the smallest addressable unit for reading and writing data, whilst a block is the smallest erasable unit.

Cells can be connected in series to form a string, with a selection transistor placed at each end. Groups of strings tend to share common control lines for the selection transistors; one called a bit line and the other called a source line. Word lines are formed by connecting together the control gate of the floating gate transistors.

Each cell can be set into one of q logical states in $Q=\{s_0, \ldots, s_{q-1}\}$, where $s_0$ corresponds to the erased state (no charge) while the remaining states represent the programmed states with a different charge for each. The cases with q=2, 4, 8 are also known as single, multi and triple-level cell (SLC, MLC and TLC) technologies respectively. The logical state of a cell is mapped into a voltage level reflecting the charge stored in its floating gate, i.e. $s_0$ reflects the lowest voltage while $s_{q-1}$ reflects the highest voltage. Without loss of generality, it can be assumed that the states themselves are the voltages.

Each cell can be treated as an individual storage medium. Since each cell can be in one of q states, each $\log_2 q$ bits can be stored into a cell by setting its voltage to the corresponding value. For example, in the case of q=4, have $11 \to s_0$, $10 \to s_1$, $00 \to s_2$ and $01 \to s_3$.

Once programmed, the voltage of a cell can be perturbed from a number of processes. The major sources of noise are random telegraph noise (RTN) and charge leakage, which are the result of physical deterioration of the floating gate transistor.

In addition to noise, cells with close proximity to a cell being programmed with a high voltage will suffer from parasitic capacitance coupling. This will make the voltage shift of a programmed cell induce a voltage shift in neighbouring cells. This effect is referred to as cell to cell interference (CCI). Cell to cell interference becomes stronger as the density of the device increases.

Furthermore, repeated programming and erasing of memory cells can lead to the cells wearing over time. This means that flash memory tends to have a finite number of program-erase cycles before data can no longer be reliably retrieved.

There is therefore a need for providing an improved method of storing data which can improve device reliability and reduce stress on individual cells.

BRIEF DESCRIPTION OF THE DRAWINGS

Arrangements of the present invention will be understood and appreciated more fully from the following detailed description, made by way of example only and taken in conjunction with drawings in which.

DETAILED DESCRIPTION

Figure 1:
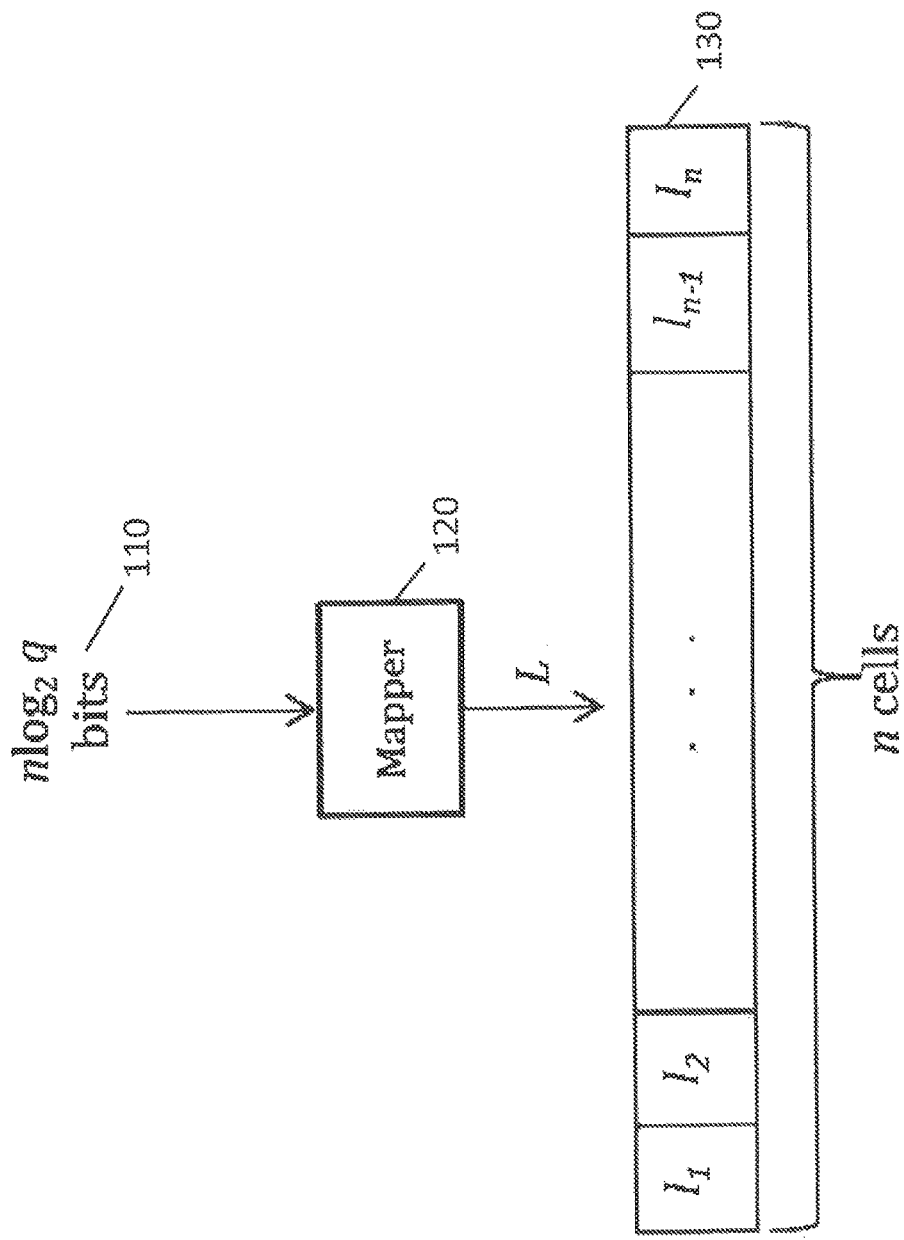
FIG. 1 shows a method of storing data.

According to a first arrangement there is provided a memory device comprising a plurality of memory cells and a controller configured to receive data to be stored in a set of memory cells and map a first portion of the data to a selection of memory cells to be programmed from the set of memory cells, wherein the number of cells to be programmed k is less than number of cells in the set n. The controller is further configured to map a second portion of the data to a plurality of voltage levels to be programmed into the memory cells to be programmed and store the first and second portions of the data in the set of memory cells by programming each memory cell of the selection of memory cells to be programmed to a respective voltage level of the plurality of voltage levels.

By dividing the data into first and second portions and storing the first portion in the form of a selection of programmed memory cells (a particular pattern of programmed memory cells), cell to cell interference can be reduced by increasing the number of cells in the erased state. In the present arrangement "programmed memory cells" refers to any memory cell that is programmed to a voltage level above that indicative of the erased state.

The memory may be non-volatile memory, for instance, flash memory. In the present arrangement, the first and second portions of the data are different, i.e. input data is divided into the first and second portions.

The selection may be a unique pattern or combination of memory cells taken from the set of memory cells. By mapping the first portion of data to a selection of memory cells to be programmed, the first portion of data may be encoded in the form of indices representing the location of the memory cells to be programmed. The selection may therefore be a combination of indices of memory cells, with each index indicating a location of the memory cell within the set. The set of memory cells may be a word line of NAND memory. The number of cells to be programmed k may be a predefined number.

According to an arrangement storing the first and second portions of the data comprises ensuring that each memory cell of the set of memory cells that has not been selected for programming has a voltage level indicating that the cell is erased. This may mean erasing memory cells that have previously been programmed or keeping erased cells erased. A voltage level indicating that a cell is erased can be considered to be the lowest programmed state ($s_0$).

According to an arrangement the number of cells to be programmed k divided by the total number of memory cells in the set n is equal to:

$$\frac{k}{n} = \frac{q-1}{q}$$

wherein q is the total number of voltage levels that each memory cell may occupy. This provides maximum storage efficiency.

According to a further arrangement the mapping of the first portion of the data to the selection of memory cells to be programmed comprises mapping the first portion of the data to a decimal number m, and determining a predetermined number k of indices $i_k$, each index $i_k$ indicating the location of a respective memory cell to be programmed into the set of memory cells, the indices satisfying:

$$m = C(i_k, k) + C(i_{k-1}, k-1) + \ldots + C(i_1, 1)$$

wherein $C(i_x, x)$ is the binomial coefficient for a selection of $i_x$ distinct values from a total of x values, and $n > i_k > i_{k-1} > \ldots > i_1$ wherein n is the total number of memory cells in the set. Accordingly, the mapping of the first portion of the data to the selection of memory cells to be programmed may utilise a combinatorial number system. This provides a more efficient method of determining the selection of memory cells to be programmed. The indices may range from 0 to n−1. The mapping to a decimal number m may comprise a binary to decimal conversion.

According to an arrangement determining the predetermined number k of indices $i_k$ comprises: a) setting a counter x to equal k and a further decimal number m' to equal the decimal number m; b) determining the largest index $i_x$ that satisfies:

$$C(i_x, x) \leq m'$$

c) updating the further decimal number m' such that:

$$m' = m' - C(i_x, k)$$

and, d) if the counter x is equal to one then output the set of k indices $\{i_1, i_2, \ldots, i_k\}$, otherwise, repeating steps b-d.

According to a further arrangement there is provided a method of storing data in a memory device comprising a plurality of memory cells and a controller, the method comprising the controller: receiving data to be stored in a set of memory cells; mapping a first portion of the data to a selection of memory cells to be programmed from the set of memory cells, wherein the number of cells to be programmed k is less than number of cells in the set n; mapping a second portion of the data to a plurality of voltage levels to be programmed into the memory cells to be programmed; and, storing the first and second portions of the data in the set of memory cells by programming each memory cell of the combination of memory cells to be programmed to a respective voltage level of the plurality of voltage levels.

According to an arrangement storing the first and second portions of the data comprises ensuring that each memory cell of the set of memory cells that has not been selected for programming has a voltage level indicating that the cell is erased.

According to a further arrangement the number of cells to be programmed k divided by the total number of memory cells in the set n is equal to:

$$\frac{k}{n} = \frac{q-1}{q}$$

wherein q is the total number of voltage levels that each memory cell may occupy.

According to an arrangement the mapping of the first portion of the data to the selection of memory cells to be programmed comprises: mapping the first portion of the data to a decimal number m; and, determining a predetermined number k of indices $i_x$, each index $i_x$ indicating the location of a respective memory cell to be programmed into the set of memory cells, the indices satisfying:

$$m = C(i_k, k) + C(i_{k-1}, k-1) + \ldots + C(i_1, 1)$$

wherein $C(i_x, x)$ is the binomial coefficient for a selection of $i_x$ distinct values from a total of x values, and $n > i_k > i_{k-1} > \ldots > i_1$ wherein n is the total number of memory cells in the set.

According to a further arrangement determining the predetermined number k of indices $i_k$ comprises: a) setting a counter x to equal k and a further decimal number m' to equal the decimal number m; b) determining the largest index $i_x$ that satisfies:

$$C(i_x, x) \leq m'$$

c) updating the further decimal number m' such that:

$$m' = m' - C(i_x, k)$$

and, d) if the counter x is equal to one then output the set of k indices $\{i_1, i_2, \ldots, i_k\}$, otherwise, repeating steps b-d.

According to a further arrangement there is provided a memory device comprising a plurality of memory cells and a controller configured to: determine a pattern of the programmed memory cells within a set of memory cells; determine the voltage levels of the programmed memory cells; map the pattern of the programmed memory cells to a first portion of data; and, map the voltage levels of the programmed memory cells to a second portion of data. The memory device is therefore able to decode data that is stored in the form of a pattern of programmed memory cells. By storing data in the form of a pattern of programmed memory cells, cell to cell interference can be reduced.

According to an arrangement determining the pattern of programmed memory cells comprises determining which of the plurality of memory cells has a voltage level above a threshold voltage level. The threshold voltage level may be a level separating an erased state from a programmed state.

According to a further arrangement the threshold voltage level is predefined or the threshold voltage level is determined such that exactly a predetermined number k of memory cells have a voltage level above the threshold voltage level.

According to a further arrangement determining the pattern of the programmed memory cells comprises determining a respective index $i_x$ for each programmed memory cell, each index $i_x$ indicating the position of the respective programmed memory cell within the set of memory cells. Mapping the pattern of the programmed memory cells to a first portion of data comprises: determining a decimal number m from the index $i_x$ of the programmed memory cells, wherein:

$$m=C(i_k,k)+C(i_{k-1},k-1)+\ldots+C(i_1,1)$$

wherein $C(i_x,x)$ is the binomial coefficient for a selection of $i_x$ distinct values from a total of x values, k is the number of programmed memory cells, and $n>i_k>i_{k-1}>\ldots>i_1$ wherein n is the total number of memory cells in the set; and mapping the decimal number m to the first portion of data.

The decimal number may be a combinatorial number. The mapping of a decimal number to the first portion of data may comprise mapping the decimal number to a set of bits (e.g. via a decimal to binary conversion).

According to a further arrangement there is provided a method of reading data from a memory device comprising a plurality of memory cells and a controller. The method comprises the controller: determining pattern of the programmed memory cells within a set of memory cells; determining the voltage levels of the programmed memory cells; mapping the pattern of the programmed memory cells to a first portion of data; and mapping the voltage levels of the programmed memory cells to a second portion of data.

According to a further arrangement determining the pattern of programmed memory cells comprises determining which of the plurality of memory cells has a voltage level above a threshold voltage level.

According to an arrangement the threshold voltage level is predefined or the threshold voltage level is determined such that exactly a predetermined number k of memory cells have a voltage level above the threshold voltage revel.

According to an arrangement determining the pattern of the programmed memory cells comprises determining a respective index $i_x$ for each programmed memory cell, each index $i_x$ indicating the position of the respective programmed memory cell within the set of memory cells. Mapping the pattern of the programmed memory cells to a first portion of data comprises: determining a decimal number in from the index $i_x$ of the programmed memory cells, wherein:

$$m=C(i_k,k)+C(i_{k-1},k-1)+\ldots+C(i_1,1)$$

wherein $C(i_x,x)$ is the binomial coefficient for a selection of $i_x$ distinct values from a total of x values, k is the number of programmed memory cells, and $n>i_k>i_{k-1}>\ldots>i_1$ wherein n is the total number of memory cells in the set; and mapping the decimal number m to the first portion of data.

Arrangements provide a means of storing data in memory in which cell to cell interference is reduced by encoding data in the form of a pattern of programmed and unprogrammed cells. This also improves the lifetime of flash memory as the number of erase cycles is reduced by reducing the number of cells that are programmed in each word line.

Amplitude Programming

FIG. 1 shows a method of storing data. FIG. 1 describes a method of storing data where n $\log_2$ q bits 110 are mapped 120 into a q-ary vector $L=(l_1,\ldots,l_n)\in Q^n$ and the pattern is written into the n cells 130 of a word-line. This method of conveying information will be termed amplitude programming (AP). Let X represent the vector of voltages to which each cell is first programmed. In the case of amplitude programming, X=L.

Cell Location Programming

Cell location programming (CLP) differs from the amplitude programming (AP) method of storing information in its fundamental working principles. According to an arrangement, a fixed number of cells are left unprogrammed (i.e. erased) and the pattern of programmed and unprogrammed cells is used to represent further stored data. Accordingly, the charge density is reduced within the memory device as a number of cells are left unprogrammed. This reduces the chance of cell to cell interference and charge leakage. Moreover, by reducing the number of cells that are programmed, the number of program and erase cycles is reduced thereby reducing the stress on individual cells and improving the lifespan of the memory device overall.

As discussed, the pattern of programmed and unprogrammed cells can be used to encode data. Consider a word line with n cells and each cell having q programmable states. All cells are initially in the erased state, $s_0$. Assume that exactly k cells are chosen out of the n cells to be programmed while the other (n−k) cells are left in the erased state $s_0$. There are C distinct possible ways to choose such k cells where C is the binomial coefficient:

$$C(n,k) = \frac{n!}{k!(n-k)!}$$

Each of the cells chosen for programming can be programmed to one of (q−1) possible states (as there are a total of q possible states including $s_0$ for an unprogrammed cell). Let $F_m=f(f_{m,1},\ldots,f_{m,k})$ be a vector representing the states for each of the m combinations of programmed cells, where m∈C(n,k) and a $f_{m,k}\in Q\setminus\{s_0\}$. This states that, for every combination, in, of k cells from the set of C(n,k) possible combinations, the cells can be programmed to one of $\{s_1,\ldots,s_{q-1}\}$ levels. Each of the k cells is programmed to one of a total of q−1 possible voltage levels. Thus, for each combination, m, of k cells there are a total of $(q-1)^k$ possible voltage levels. Consequently, for all C(n,k) possible combinations there are a total of $(q-1)^k\times C(n,k)$ possible voltage levels, with each combination representing a unique pattern which can be used to program k of n available cells. This is termed cell location programming (CLP).

Figure 2:
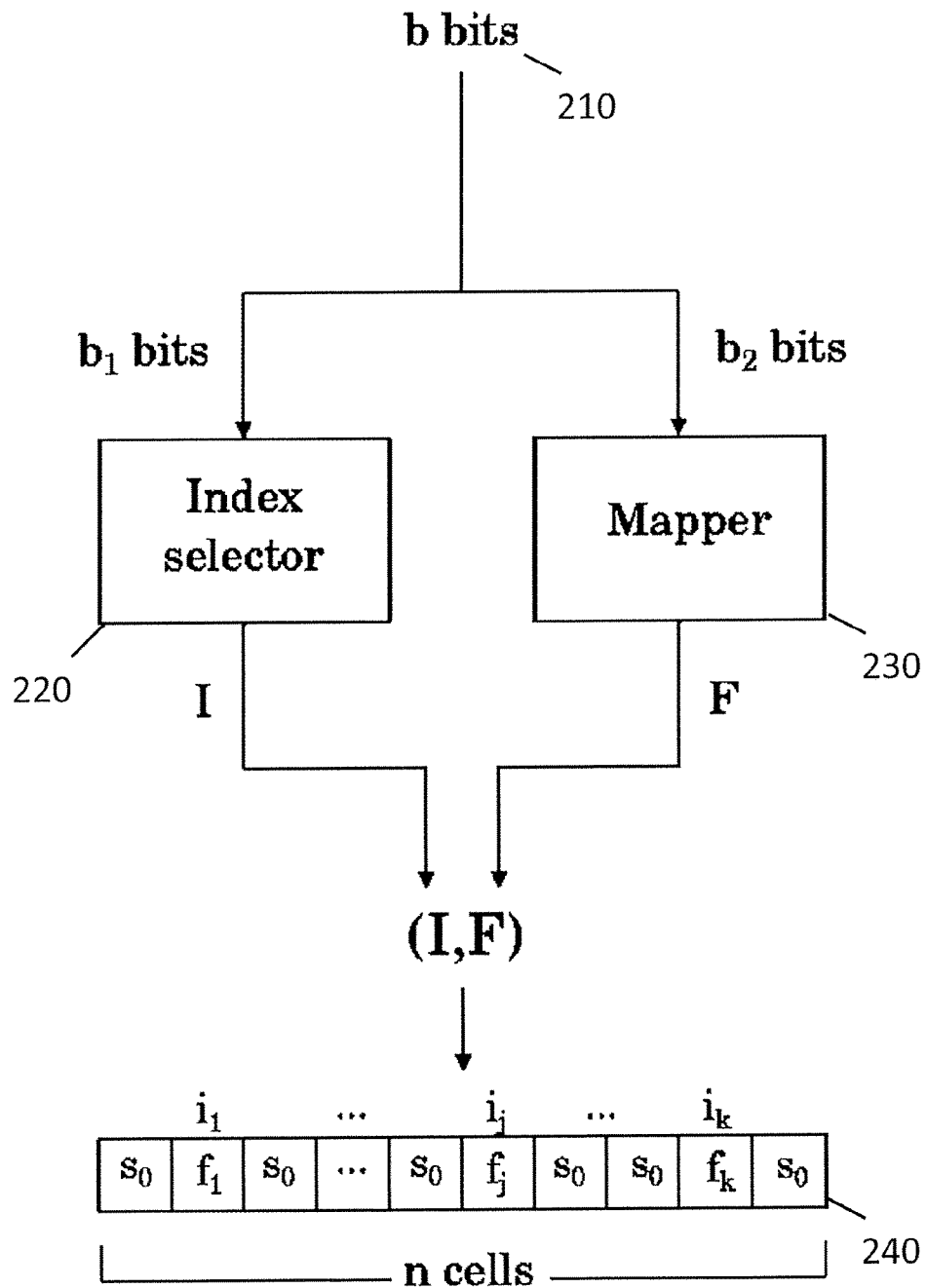
FIG. 2 shows a process by which data is stored under a cell location programming scheme according to an arrangement.

FIG. 2 shows the process by which data is stored under the cell location programming scheme according to an arrangement. An incoming stream of b bits 210 is divided into two streams of $b_1=\lfloor\log_2 C(n,k)\rfloor$ bits and $b_2=\lfloor k\log_2(q-1)\rfloor$ bits respectively such that $b=b_1+b_2$. Let $\mathfrak{T}(n,k)=\{I_1,\ldots,I_{C(n,k)}\}$ be the set of all C(n,k) distinct combinations of patterns of programmed cells, where $I_m=(i_{m,1},\ldots,i_{m,k})$, $i_{m,j}$ being the indices of then cells $i_{m,j}\in\{1,\ldots,n\}$ and $i_{m,j}\neq i_{m,r}$ for j≠r.

The first $b_1$ bits are mapped by the index selector block 220 into an element I of $\mathfrak{T}(n,k)$ representing the set of indices of the k cells to be programmed. For small n and/or k the index selector can be a simple lookup table; however, this table becomes very large when k and n are large. Another technique is provided for large k and n, as described below.

The other $b_2$ bits are mapped 230 into a (q−1)-ary stream F of size k representing the states to which each of the cells indexed by I is to be programmed.

The two mapping schemes I,F are combined to form a combined mapping that is used to program a subset of the n cells 240. The cells not present in element I are left unprogrammed (erased) at level $s_0$, whilst each of the cells indicated by element I is programmed to the one of (q−1) possible states ($s_1$ to $s_{q-1}$) according to F.

Figure 3:
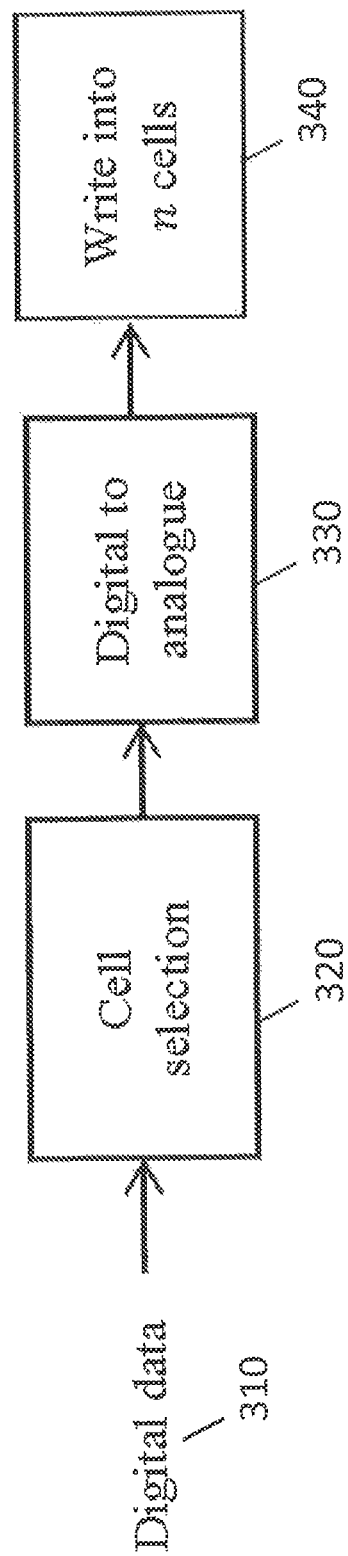
FIG. 3 shows a method of storing data according to an arrangement.

FIG. 3 shows a method of storing data according to an arrangement. This depicts a high level view of where the cell location programming would fit into a memory programming schema. Digital data is received 310. This is then input into the cell selection scheme 320 depicted in 210-240 of FIG. 2. As discussed above, this takes b bits and produces a vector of n cell threshold voltage values. These cell threshold values are input into a digital to analogue converter 330. The digital-to-analogue, converter 330 converts these values into analogue voltage thresholds which are then used to programme the n memory cells 340.

Combinatorial Mapping

The index selector step 220 of the cell selection step 320 can be implemented using a lookup table to map bits $b_1$ onto sets of indices identifying the cells to be programmed. This can, however, take a long time for large values of n and/or k and would require a very large lookup table. Accordingly, a method is provided to make the mapping of bits to a unique sequence of k programmed cells more efficient. This method utilises combinatorial numbers.

A combinatorial number system provides a one-to-one mapping between natural numbers and k-combinations (sets of k distinct indices). An index value is assigned to each possible combination of indices. The combinatorial index, m, corresponds to:

$$m = C(i_k, k) + C(i_{k-1}, k-1) + \ldots + C(i_1, 1)$$

where values $i_1$ to $i_k$ are the indices of the cells to be programmed according to the combinatorial index m and $n > i_k > i_{k-1} > \ldots > i_1$. By calculating the appropriate index values, the vector $I_m = (i_{m,1}, \ldots, i_{m,k})$ can be determined for a given combinatorial index m.

Figure 4:
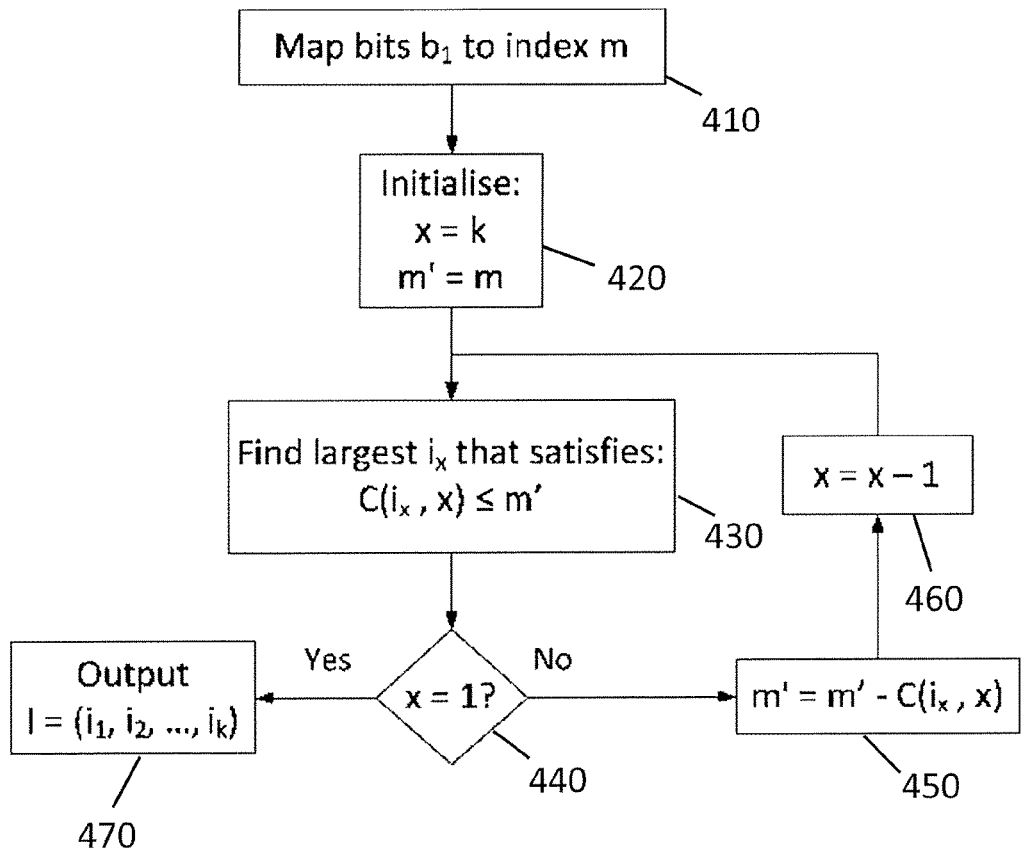
FIG. 4 shows a method of determining cell indices to be programmed according to an arrangement.

FIG. 4 shows a method of determining cell indices to be programmed according to an arrangement. A set of bits $b_1$ are mapped 410 to a given combinatorial index m, for instance, via a by a binary to decimal converter. A number of parameters are then initialised 420. A counter, x, is set to k and a decimal m' is set to equal m.

The largest cell index $i_x$ is found 430 that satisfies:

$$C(i_x, x) \leq m'$$

This can be found by any suitable method, for instance, an iterative method may be used that successively moves from higher values of $i_x$ to lower values of $i_x$ (or vice versa) until the above relationship is satisfied. Equally, a binary search algorithm may be implemented. In the event that m'=0 then is set to 0.

Once the appropriate value of $i_x$ has been found, it is determined 440 if the counter, x, is equal to 1. If not, then the binomial coefficient for that cell index is subtracted 450 from the current value of m':

$$m' = m' - C(i_x, x)$$

The counter x is decreased by one 460 and the method loops back to step 430 to calculate the next cell index $i_x$.

If x is found to equal one in step 440 then all of the required cell indices have been calculated and the method outputs 470 the vector $I = (i_1, i_2, \ldots, i_k)$ representing the cells to be programmed.

The above method provides a fast and efficient means of determining the indices of the cells to be programmed based on a set of input bits $b_1$.

As an example, let n=7 and k=3, for which there are 35 possible combinations, enumerated from 0 to 34. The combinatorial index value 31 can then be written as follows:

$$31 = C(i_1, 3) + C(i_2, 2) + C(i_3, 1)$$

The first cell index, $i_1$, is determined first. In this case, the largest value of $i_1$ that satisfies $C(i_1, 3) \leq 31$ is $i_1 = 6$ as C(6,3)=20, which is smaller than 31, whereas C(7,3)=35, which is too large.

The next cell index, $i_2$, is determined, this time by finding the largest value that satisfies $C(i_2, 2) \leq m'$ where m'=31−20=11. In this case, this is $i_2 = 5$ as C(5,2)=10.

Finally, $i_3$ is determined to be 1 as C(1,1)=1, which is less than or equal to 11−10=1.

The combinatorial index value therefore represents:

$$31 = C(6,3) + C(5,2) + C(1,1)$$

Thus, the index value 31 can be used to represent the k=3 cell locations that have cell indices {6,5,1}.

Data Detection

When reading data from the memory cells, it can be efficient to read only the k cells that are programmed, as the remaining cells are known to have been set to $s_0$. Prior to determining the data held in the k programmed storage cells, precisely k cells need to be selected for reading.

Figure 5:
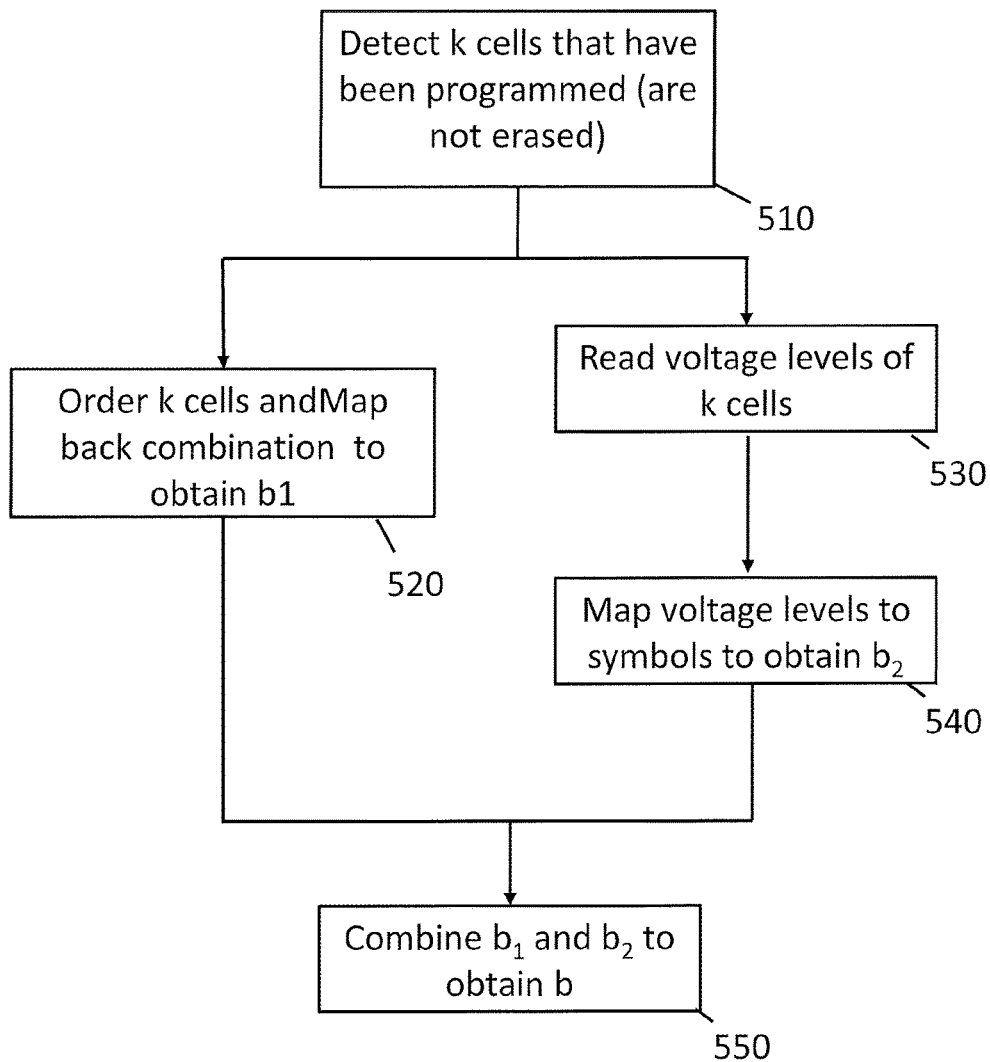
FIG. 5 shows a method of reading data from a cell location programmed memory according to an arrangement.

FIG. 5 shows a method of reading data from a cell location programmed memory according to an arrangement. Firstly, the k programmed cells (those that occupy a state that is not the erased state, $s_0$) are detected 510. Then, the indices of the k programmed cells are ordered and the combination is mapped back 520 to obtain the bits that derive from the programming pattern, $b_1$. As with the equivalent mapping when writing to memory, this can be achieved via a look up table, or a combinatorial number system as described above. For instance, once the index values of the programmed cells is known, the combinatorial index m may be determined via:

$$m = C(i_k, k) + C(i_{k-1}, k-1) + \ldots + C(i_1, 1)$$

and this combinatorial index m can then be mapped back to the sequence of bits, $b_1$, for instance, via a decimal-to-binary converter.

The location of the programmed cells is also used to determine the bits stored in these cells. The voltage level programmed into each programmed cell is determined 530 and these values are mapped back to their symbol values 540 to determine the bits that are stored in the cells themselves, $b_2$.

The two sets of bits, $b_1$ and $b_2$, are then combined 550 to obtain the full set of stored bits, b.

One method for selecting k cells is to use fixed voltage threshold values, by careful selection of these threshold values precisely k programmed cell locations can be identified by comparing the voltage levels from a number of cells, b (where b>k) to the threshold values.

Figure 6:
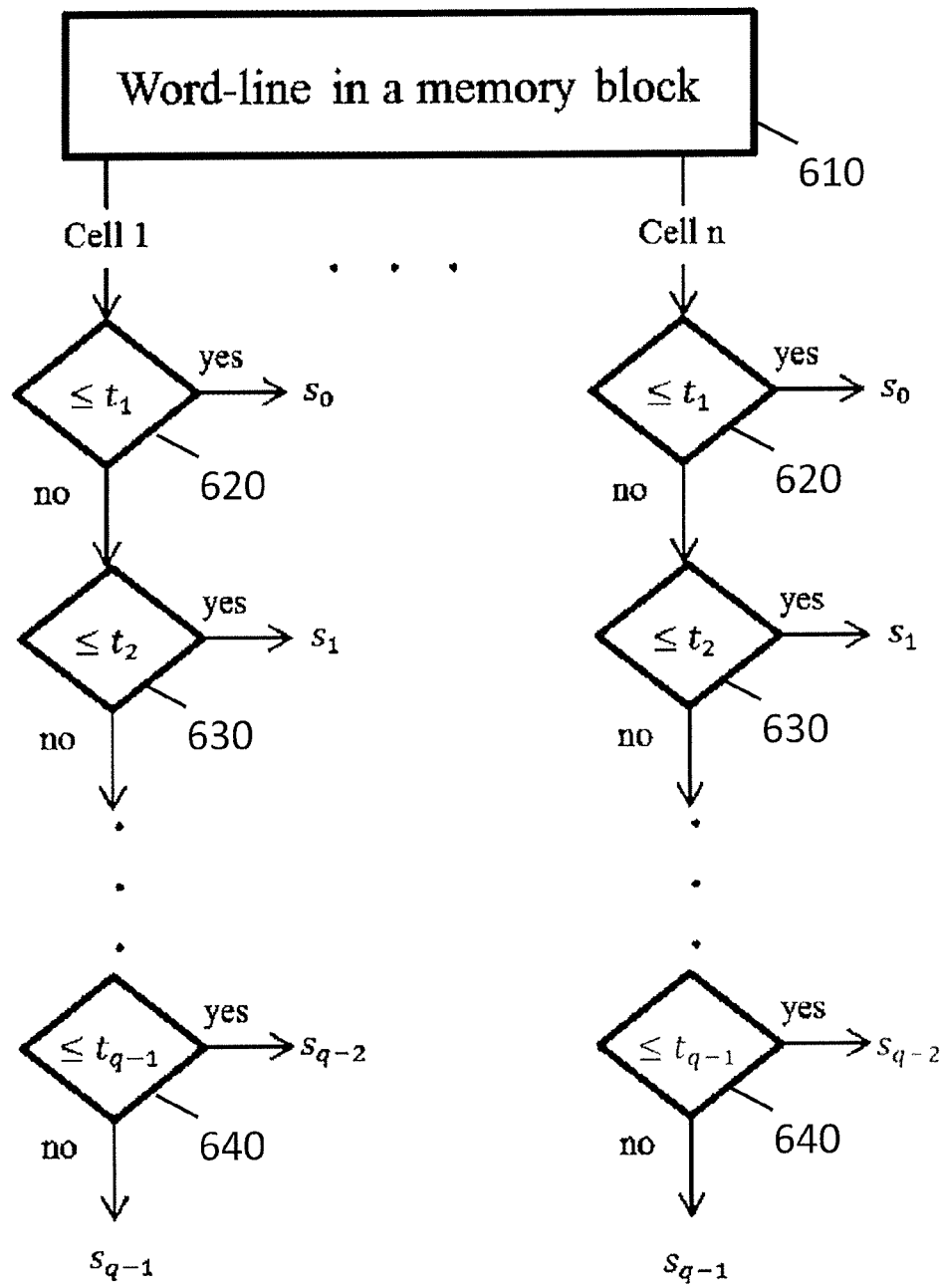
FIG. 6 shows a method of determining the location of the programmed cells using a fixed threshold according to an arrangement.

FIG. 6 shows a method of determining the location of the programmed cells using a fixed threshold according to an arrangement. A word line in a memory cell is selected 610. Each of the n cells in the word line is then compared 620 to a first threshold, $t_1$. If the voltage level of a cell is less than or equal to the threshold $t_1$, then the cell is determined to be in the unprogrammed (erased) state, $s_0$. If the voltage level of a cell exceeds the first threshold then the cell is deemed to be programmed.

At this stage, the location of the programmed and unprogrammed cells has been determined (the cells that have a voltage level that exceeds $t_1$ are the programmed cells). This can therefore be used to determine to $b_1$. The method then proceeds, however, to determine the programmed states for the programmed cells.

The voltage level of each programmed cell is then compared 630 to a second threshold, $t_2$. If the voltage level of the cell is less than or equal to the second threshold then the cell is determined to be in the first programmed state, $s_1$. If not, then the method moves on to compare the voltage to the next threshold. This method continues for each of q−1 thresholds.

If the voltage of a cell is not less than or equal to the highest threshold, $t_{q-1}$, then the cell is determined to be in the highest programmed state, $s_{q-1}$; otherwise, it is deemed to be in the second highest state, $s_{q-2}$.

Figure 7:
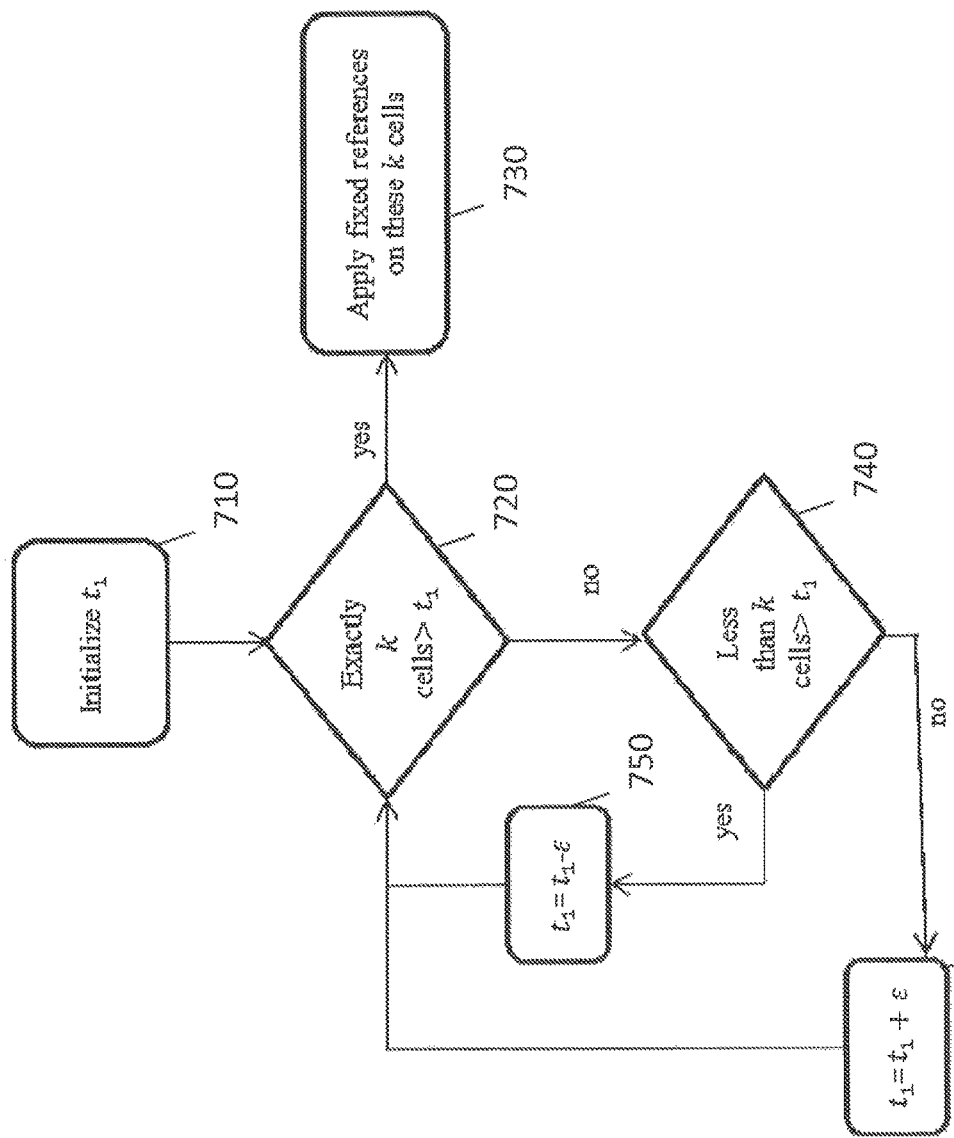
FIG. 7 shows a further method for determining the positions of k programmed cells according to an arrangement.

FIG. 7 shows a further method for determining the positions of k programmed cells according to an arrangement. Here, an iterative adjustment of a threshold voltage, $t_1$, by an amount $\epsilon$ is carried out until exactly k cells are detected. This guarantees that the correct cells will be read even though the voltages levels may drift over time.

The method begins by setting an initial value for $t_1$. This may be predefined. The voltage levels of all of the cells are then compared to $t_1$ and the number of cells that have voltage levels that exceed $t_1$ is determined. It is determined 720 if exactly k cells have voltage levels that exceed $t_1$. If exactly k cells exceed $t_1$ then these cells are determined to be the k programmed cells. The locations of these cells are output to allow the $b_1$ bits to be determined based on the programming pattern and fixed references are applied 730 to the programmed cells to determine their exact programming state to allow the $b_2$ bits to be determined (as shown in steps 630-640 of FIG. 6).

If the number of cells that have voltage levels that exceed $t_1$ does not exactly equal k then it is determined 730 if less than k cells exceed $t_1$ to determine how to adjust the threshold $t_1$. If the number of cells that exceed $t_1$ is less than k then the threshold is lowered 750 by a predetermined amount $\epsilon$; otherwise, the threshold is increased 760 by $\epsilon$. This method then returns to step 720 to check whether exactly k cells have voltage levels that exceed the new value of $t_1$. Accordingly, the threshold is iteratively adapted until exactly k programmed cells have been located.

The arrangements described herein provide a number of advantages when compared to existing methods of data storage, namely:
 i. when $k<n(q-1)/q$, the average interference a cell suffers from is reduced, this translates into fewer detection errors;
 ii. since programmed cells shifting from one programmed state to another does not create an error, the set of indices of programmed cells will be more robust;
 iii when $k=n(q-1)/q$, using the k-highest detector, the proposed scheme has better resilience to the stored data being read erroneously than existing methods;
 iv. when $k<n(q-1)/q$, the long term deterioration of storage cells is slower on average because on average less cells will be exposed to the higher stress that results from repeated programming and erasing.

Figure 8:
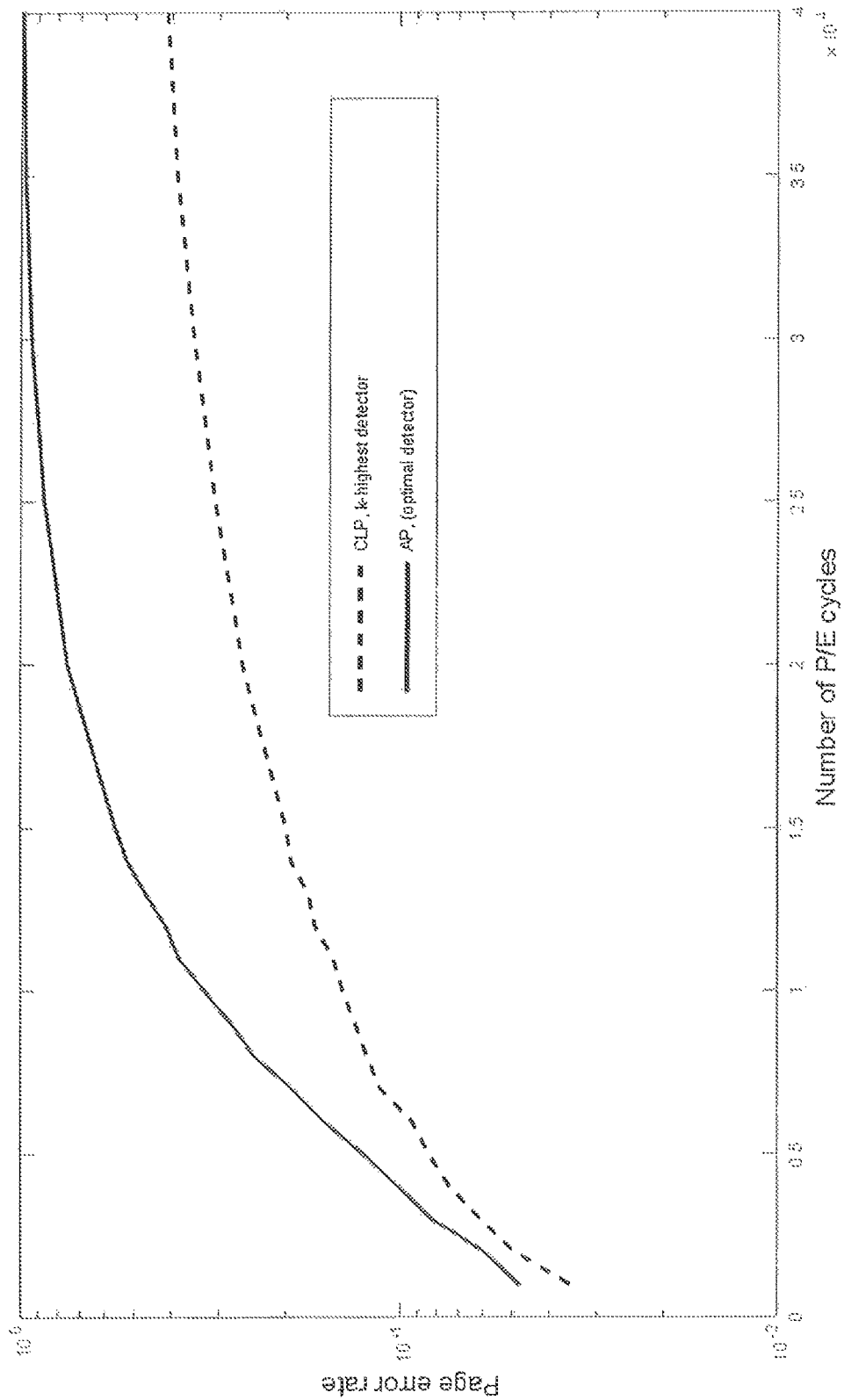
FIG. 8 shows the page error rate for an index page using the cell location programming (CLP) scheme compared to the page error rate far a least significant bit (LSB) page using the amplitude programming (AP) scheme.

FIG. 8 shows the page error rate for the index page using the cell location programming (CLP) scheme compared to the page error rate for the least significant bit (LSB) page using the amplitude programming (AP) scheme. The index page stores the indices of the programmed cells. For the CLP case half of the cells in the page were programmed (the fraction of cells programmed was k/n=0.5) with q=4. As the number of program/erase (PIE) cycles increases (i.e. as the device ages) the proposed scheme is seen to have significantly better performance over the AP scheme.

Figure 9:
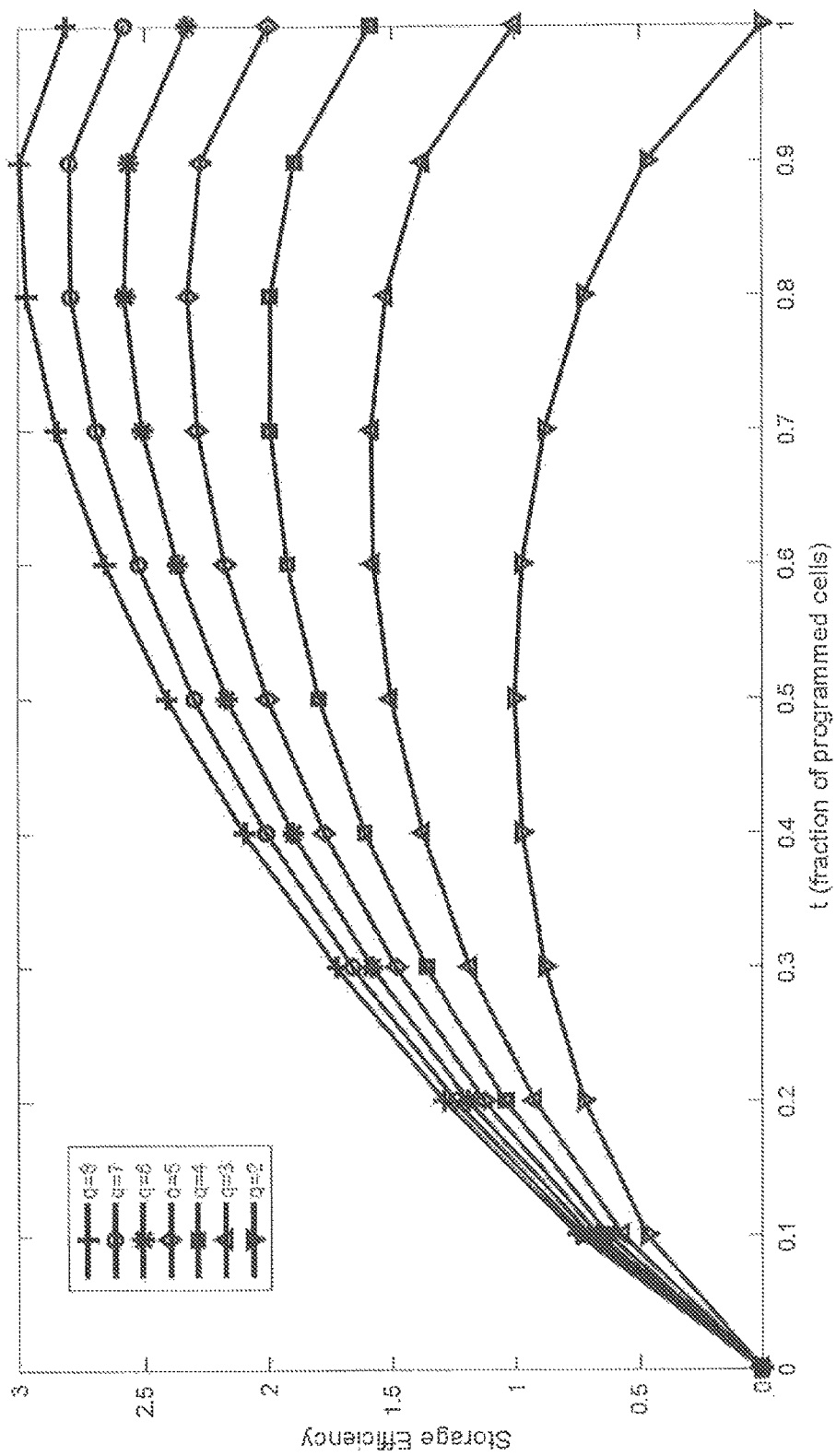
FIG. 9 shows the asymptotic (as $n \to \infty$) storage efficiency of the CLP scheme as a function of the fraction of programmed cells t for different values of q.

FIG. 9 shows the asymptotic (as $n \to \infty$) storage efficiency of the CLP scheme as a function of the fraction of programmed cells t for different values of q. Storage efficiency is defined as the average number of bits that can be stored in a cell. It can be seen that storage efficiency increases with the number of programmable states q per memory cell. The maximal storage efficiency for each value of q is obtained at:

$$t = \frac{k}{n} = \frac{q-1}{q}$$

Accordingly, the maximum storage efficiency for q from 1 to 8 is obtained at:

| q | t = (q − 1)/q |
|---|---|
| 2 | 0.5 |
| 3 | 0.666667 |
| 4 | 0.75 |
| 5 | 0.8 |
| 6 | 0.8333.93 |
| 7 | 0.857143 |
| 8 | 0.875 |

This can be seen via the locations of the maxima in FIG. 9.

Figure 10:
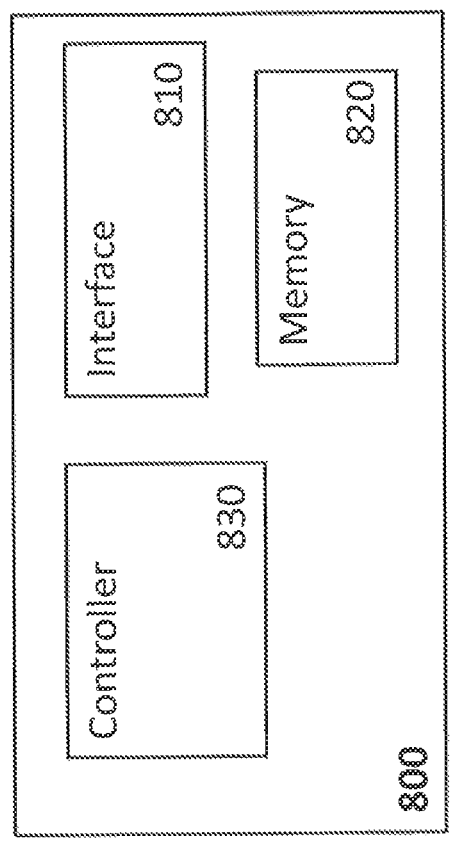
FIG. 10 shows a memory device according to an arrangement.

FIG. 10 shows a memory device according to an arrangement. The device 800 comprises an interface 810 for receiving and outputting data, memory 820 for storing data and a controller 830 for managing the storage of data in the memory device 800.

The interface 810 is configured to interface with other interfaces such as monitors, printers and keyboards, other computers, etc. The interface 810 may consist of a single port or may comprise a plurality of ports for interfacing with external electronic equipment. Whilst a joint input and output interface 810 is shown in FIG. 10, in an alternative arrangement the interface 810 may be divided into separate input and output interfaces.

The interface 810 is configured to provide data to the controller 830 for storage in the memory 820. Alternatively, the controller 820 may generate the data to be stored itself through processes performed in the controller 820.

The controller 830 is configured to implement the functions of the memory device 800 as described herein. The controller 830 is therefore configured to control the memory 820 to store data in the memory 820 according to the cell location programming scheme. The controller 830 is also configured to read data from the memory 820 according to the cell location programming scheme. Data read from the memory 820 may be provided to the interface 810 so that it may be output. Alternatively, the controller 830 may perform processes on the data read from the memory 820 before storing or outputting the processed data. The controller 830 executes its functions based on executable software code stored in memory 820.

The memory 820 is non-volatile NAND flash memory. The memory 820 is divided into a number of blocks. The blocks are the smallest erasable unit in the memory 820. Each block is divided into a number of pages, each comprising a number of memory cells. A page is the smallest programmable unit in the memory 820. Each page comprises n memory cells. The controller 830 is configured to store a pattern of k programmed cells in each page of memory cells.

According to the cell location programming scheme described herein, a portion of the data stored in the memory 820 is stored in the form of a particular pattern of programmed memory cells and non-programmed memory cells. By forcing only a subset k out of a total of n memory cells to be programmed, leaving the remainder unprogrammed, additional information is conveyed by the location of the k programmed cells since each combination represents a unique state. In the example of multi-level flash memory, since a cell can be programmed to different states other than the unprogrammed (erased) state, information can be stored in the threshold voltage levels of the k programmed cells.

This scheme can achieve a storage efficiency ratio as high as 0.9 when compared with the conventional method of programming. This small reduction of storage efficiency brings significant gains in device reliability. By only subjecting a subset of cells in the block to high program voltages, stress on individual cells is reduced and, significantly, the probability of severe cell to cell interference is also reduced.

Specifically, the methods described herein provide a reduction in the interference between cells as fewer cells store a charge. There is also an increase in the lifetime of the memory device 800 as, on average, each cell undergoes a reduced number of program and erase cycles (as many cells remain erased between the storage of two sets of data). Furthermore, this scheme provides a more reliable means of storing data as the data stored in the form of the pattern of programmed cells is unaffected by any of the programmed cells shifting from one programmed state to another.

Cell location programming is technology agnostic. Accordingly, whilst the above arrangements are described with reference to NAND flash memory, alternative arrangements utilise alternative storage technologies.

While certain arrangements have been described, the arrangements have been presented by way of example only, and are not intended to limit the scope of the inventions. Indeed, the novel methods and devices described herein may be embodied in a variety of other forms; furthermore, various omissions, substitutions and changes in the form of the methods and systems described herein may be made.

The invention claimed is:

1. A memory device comprising a plurality of memory cells and a controller configured to:
   receive data to be stored in a set of memory cells;
   divide the data to be stored into a first portion and a second portion;
   select indices of a selection of memory cells to be programmed from the set of memory cells according to the first portion of data, wherein the number of cells to be programmed k is less than number of cells in the set n;
   map the second portion of the data to a plurality of voltage levels to be programmed into the memory cells to be programmed; and
   store the first and second portions of the data in the set of memory cells by programming each memory cell of the selection of memory cells to be programmed to a respective voltage level of the plurality of voltage levels.

2. A memory device according to claim 1 wherein storing the first and second portions of the data comprises ensuring that each memory cell of the set of memory cells that has not been selected for programming has a voltage level indicating that the cell is erased.

3. A memory device according to claim 1, wherein the number of cells to be programmed k divided by the total number of memory cells in the set n is equal to:

$$\frac{k}{n} = \frac{q-1}{q}$$

wherein q is the total number of voltage levels that each memory cell may occupy.

4. A memory device according to claim 1, wherein selecting of the indices of the selection of memory cells to be programmed comprises:
   mapping the first portion of the data to a decimal number m; and
   determining a predetermined number k of indices $i_k$, each index $i_k$ indicating the location of a respective memory cell to be programmed into the set of memory cells, the indices satisfying:

$$m = C(i_k, k) + C(i_{k-1}, k-1) + \ldots + C(i_1, 1)$$

wherein $C(i_x, x)$ is the binomial coefficient for a selection of $i_x$ distinct values from a total of x values, and $n > i_k > i_{k-1} > \ldots > i_1$ wherein n is the total number of memory cells in the set.

5. A memory device according to claim 4 wherein determining the predetermined number k of indices $i_k$ comprises:
   a) setting a counter x to equal k and a further decimal number m' to equal the decimal number m;
   b) determining the largest index $i_x$ that satisfies:

$$C(i_x, x) \leq m'$$

c) updating the further decimal number m' such that:

$$m' = m' - C(i_x, k)$$

and,
   d) if the counter x is equal to one then output the set of k indices $\{i_1, i_2, \ldots, i_k\}$, otherwise, repeating steps b-d.

6. A method of storing data in a memory device comprising a plurality of memory cells and a controller, the method comprising the controller:
   receiving data to be stored in a set of memory cells;
   dividing the data to be stored into a first portion and a second portion;
   selecting indices of a selection of memory cells to be programmed from the set of memory cells according to the first portion of data, wherein the number of cells to be programmed k is less than number of cells in the set n;
   mapping the second portion of the data to a plurality of voltage levels to be programmed into the memory cells to be programmed; and
   storing the first and second portions of the data in the set of memory cells by programming each memory cell of the combination of memory cells to be programmed to a respective voltage level of the plurality of voltage levels.

7. A method according to claim 6 wherein storing the first and second portions of the data comprises ensuring that each memory cell of the set of memory cells that has not been selected for programming has a voltage level indicating that the cell is erased.

8. A method according to claim 6, wherein the number of cells to be programmed k divided by the total number of memory cells in the set n is equal to:

$$\frac{k}{n} = \frac{q-1}{q}$$

wherein q is the total number of voltage levels that each memory cell may occupy.

9. A method according to claim 6, wherein the selecting of the indices of the selection of memory cells to be programmed comprises:

mapping the first portion of the data to a decimal number m; and determining a predetermined number k of indices $i_x$, each index $i_x$ indicating the location of a respective memory cell to be programmed into the set of memory cells, the indices satisfying:

$$m=C(i_k,k)+C(i_{k-1},k-1)+ \ldots +C(i_1,1)$$

wherein $C(i_x,x)$ is the binomial coefficient for a selection of $i_x$ distinct values from a total of x values, and $n > i_k > i_{k-1} > \ldots > i_1$ wherein n is the total number of memory cells in the set.

10. A method according to claim 9 wherein determining the predetermined number k of indices $i_k$ comprises:
   a) setting a counter x to equal k and a further decimal number m' to equal the decimal number m;
   b) determining the largest index $i_x$ that satisfies:

$$C(i_x,x) \leq m'$$

c) updating the further decimal number m' such that:

$$m'=m'-C(i_x,k)$$

and,
   d) if the counter x is equal to one then output the set of k indices $\{i_1, i_2, \ldots, i_k\}$, otherwise, repeating steps b-d.

11. A memory device comprising a plurality of memory cells and a controller configured to read first and second portions of data from programmed memory cells by:
   determining a pattern of the programmed memory cells within a set of memory cells;
   determining the voltage levels of the programmed memory cells;
   determining the first portion of data based on the pattern of the programmed memory cells within the set of memory cells; and
   determining the second portion of data based on the voltage levels of the programmed memory cells.

12. A memory device according to claim 11 wherein determining the pattern of programmed memory cells comprises determining which of the plurality of memory cells has a voltage level above a threshold voltage level.

13. A memory device according to claim 12 wherein the threshold voltage level is predefined or wherein the threshold voltage level is determined such that exactly a predetermined number k of memory cells have a voltage level above the threshold voltage level.

14. A memory device according to claim 11, wherein:
   determining the pattern of the programmed memory cells comprises determining a respective index $i_x$ for each programmed memory cell, each index $i_x$ indicating the position of the respective programmed memory cell within the set of memory cells; and
   determining the first portion of data based on the pattern of the programmed memory cells within the set of memory cells comprises:

determining a decimal number m from the index $i_x$ of the programmed memory cells, wherein:

$$m=C(i_k,k)+C(i_{k-1},k-1)+ \ldots +C(i_1,1)$$

wherein $C(i_x,x)$ is the binomial coefficient for a selection of $i_x$ distinct values from a total of x values, k is the number of programmed memory cells, and $n > i_k > i_{k-1} > \ldots > i_1$ wherein n is the total number of memory cells in the set; and
   mapping the decimal number m to the first portion of data.

15. A method of reading data from a memory device comprising a plurality of memory cells and a controller, the method comprising the controller reading first and second portions of data from programmed memory cells by:
   determining a pattern of the programmed memory cells within a set of memory cells;
   determining the voltage levels of the programmed memory cells;
   determining the first portion of data based on the pattern of the programmed memory cells within a set of memory cells; and
   determining the second portion of data based on the voltage levels of the programmed memory cells.

16. A method according to claim 15 wherein determining the pattern of programmed memory cells comprises determining which of the plurality of memory cells has a voltage level above a threshold voltage level.

17. A method according to claim 16 wherein the threshold voltage level is predefined or wherein the threshold voltage level is determined such that exactly a predetermined number k of memory cells have a voltage level above the threshold voltage level.

18. A method according to claim 15, wherein:
   determining the pattern of the programmed memory cells comprises determining a respective index $i_x$ for each programmed memory cell, each index $i_x$ indicating the position of the respective programmed memory cell within the set of memory cells; and
   determining the first portion of data based on the pattern of the programmed memory cells within the set of memory cells comprises:
   determining a decimal number m from the index $i_x$ of the programmed memory cells, wherein:

$$m=C(i_k,k)+C(i_{k-1},k-1)+ \ldots +C(i_1,1)$$

wherein $C(i_x,x)$ is the binomial coefficient for a selection of $i_x$ distinct values from a total of x values, k is the number of programmed memory cells, and $n > i_k > i_{k-1} > \ldots > i_1$ wherein n is the total number of memory cells in the set; and
   mapping the decimal number m to the first portion of data.

* * * * *